United States Patent

Durham et al.

[11] Patent Number: 6,037,804
[45] Date of Patent: Mar. 14, 2000

[54] REDUCED POWER DYNAMIC LOGIC CIRCUIT THAT INHIBITS REEVALUATION OF STABLE INPUTS

[75] Inventors: Christopher McCall Durham; Visweswara Rao Kodali; Michael Ju Hyeok Lee, all of Austin; Douglas Ele Martin, Round Rock; Harsh Dev Sharma, Austin, all of Tex.

[73] Assignee: International Business Machines Corporation, Armonk, N.Y.

[21] Appl. No.: 09/049,741

[22] Filed: Mar. 27, 1998

[51] Int. Cl.[7] .................. H03K 19/00; H03K 19/096; H03K 19/094

[52] U.S. Cl. .................. 326/97; 326/93; 326/95; 326/98; 326/121

[58] Field of Search ................... 326/93, 95, 96, 326/97, 98, 104, 112, 119, 121

[56] References Cited

U.S. PATENT DOCUMENTS

| | | |
|---|---|---|
| 5,203,003 | 4/1993 | Donner . |
| 5,220,672 | 6/1993 | Nakao et al. . |
| 5,453,708 | 9/1995 | Gupta et al. ........................ 326/98 |
| 5,587,672 | 12/1996 | Ranganathan et al. . |
| 5,604,454 | 2/1997 | Maguire et al. . |
| 5,634,131 | 5/1997 | Matter et al. . |
| 5,859,547 | 1/1999 | Tran et al. ........................ 326/98 |

*Primary Examiner*—Michael Tokar
*Assistant Examiner*—Vibol Tan
*Attorney, Agent, or Firm*—Anthony V.S. England; Brian F. Russell; Andrew J. Dillon

[57] ABSTRACT

A reduced-power integrated circuit includes a circuit data input, a circuit data output, and at least one row of dynamic logic. The row of dynamic logic includes a row clock input, a row data input, and a row data output coupled to the circuit data output, where a value received at the row data input is derived from the value at the circuit data input. The integrated circuit further includes a comparator that compares current and previous values at the circuit data input and a switch that selectively sets the row clock signal received at the row clock input to an inactive state and temporarily maintains the row clock signal in the inactive state in response to the comparator detecting that the current previous values of at the circuit data input are equivalent. Consequently, the row of dynamic logic does not (and need not) reevaluate the circuit data input value, and power dissipation is reduced.

21 Claims, 5 Drawing Sheets

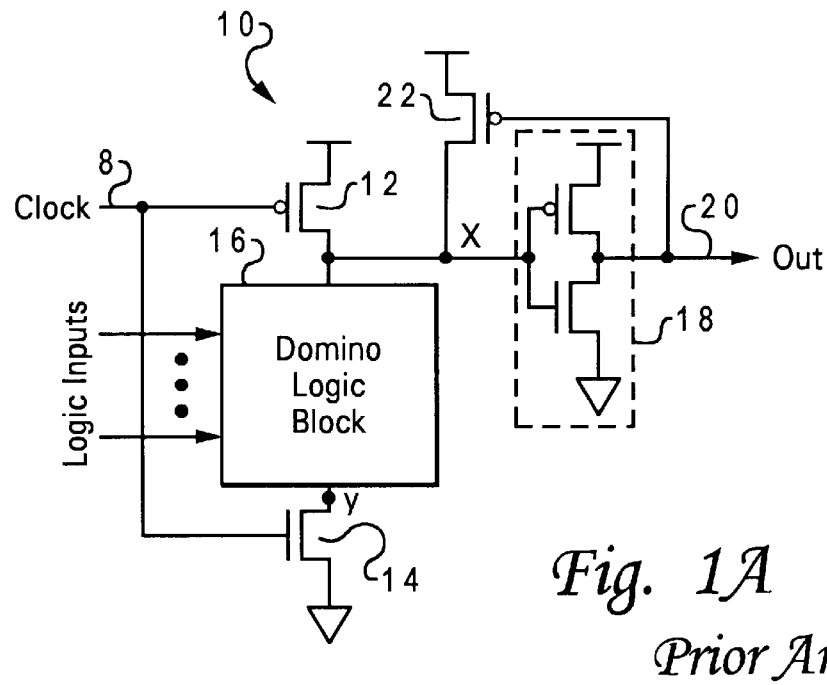
Fig. 1A
Prior Art
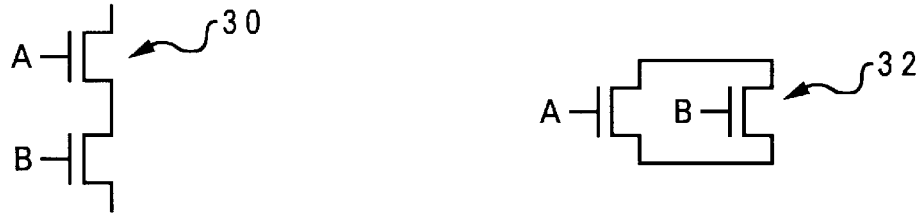
Fig. 1B
Prior Art
Fig. 1C
Prior Art
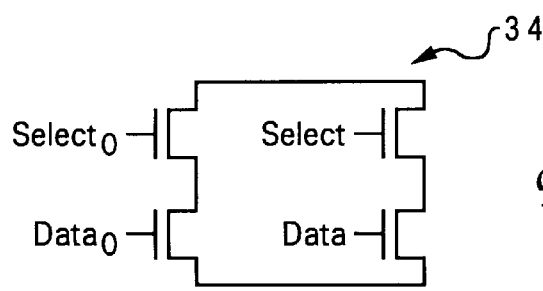
Fig. 1D
Prior Art

REDUCED POWER DYNAMIC LOGIC CIRCUIT THAT INHIBITS REEVALUATION OF STABLE INPUTS

BACKGROUND OF THE INVENTION

1. Technical Field

The present invention relates in general to electronic circuitry and, in particular, to dynamic logic digital circuitry. Still more particularly, the present invention relates to reduced power dynamic logic circuitry that inhibits the reevaluation of logic inputs during clock cycles in which the logic inputs remain unchanged.

2. Description of the Related Art

As integrated circuits have achieved higher clock speeds and are fabricated with ever increasing densities, power dissipation has become a primary consideration in integrated circuit design. While the need for reduced power integrated circuits is of particular concern in the design of battery-powered devices such as portable computers, applications for reduced-power integrated circuits extend to desktop computer systems and other electronic devices due to power supply and heat dissipation considerations.

As is well-known to those skilled in the art, a conventional dynamic logic integrated circuit divides a clock cycle into precharge and evaluate phases. During the precharge phase, the dynamic logic circuit is preset to a known logic state, and during the evaluate phase, the logic inputs of the dynamic logic circuit are evaluated by circuitry that implements a logic function to determine a logic output. Importantly, a conventional dynamic logic circuit evaluates its logic inputs during the evaluate phase of each cycle, and accordingly consumes switching power during each cycle.

Therefore, a need arises for a reduced-power dynamic logic circuit.

SUMMARY OF THE INVENTION

It is therefore one object of the present invention to provide improved electronic circuitry.

It is another object of the present invention to provide reduced-power dynamic logic digital circuitry.

The foregoing objects are achieved as is now described. A reduced-power integrated circuit includes a circuit data input, a circuit data output, and at least one row of dynamic logic. The row of dynamic logic includes a row clock input, a row data input, and a row data output coupled to the circuit data output, where a value received at the row data input is derived from the value at the circuit data input. The integrated circuit further includes a comparator that compares current and previous values at the circuit data input and a switch that selectively sets the row clock signal received at the row clock input to an inactive state and temporarily maintains the row clock signal in the inactive state in response to the comparator detecting that the current previous values of at the circuit data input are equivalent. Consequently, the row of dynamic logic does not (and need not) reevaluate the circuit data input value, and power dissipation is reduced.

Thus, in contrast to prior art dynamic logic circuits that drive their output loads during clock cycles in which the logic inputs have remained stable, the present invention advantageously reduces the power consumed by a dynamic logic circuit through inhibiting the dynamic logic circuit from driving the output load during clock cycles in which the logic inputs remain unchanged from the previous clock cycle. In this manner, switching power is not unnecessarily consumed during cycles in which the logic inputs have remained stable.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1A illustrates a conventional domino dynamic logic circuit;

FIG. 1B depicts a two-input AND gate implemented utilizing domino logic;

FIG. 1C illustrates a two-input OR gate implemented utilizing domino logic;

FIG. 1D depicts a two-input multiplexer implemented utilizing dynamic logic;

DETAILED DESCRIPTION OF ILLUSTRATIVE EMBODIMENTS

Figure 1E:
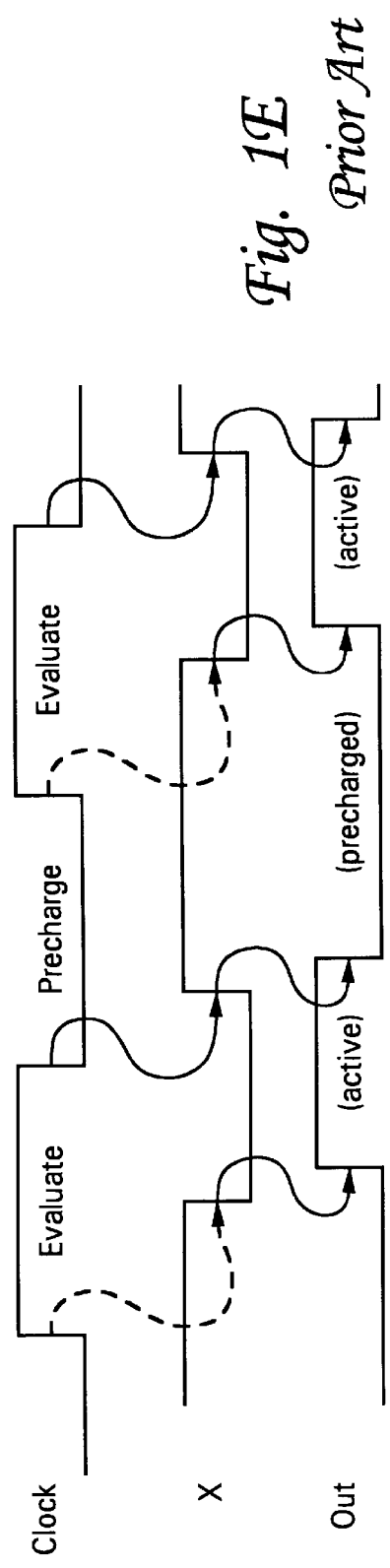
FIG. 1E is a timing diagram illustrating the operation of the conventional domino dynamic logic circuit depicted in FIG. 1A.

With reference now to the figures and in particular with reference to FIG. 1A, there is illustrated a schematic diagram of a conventional dynamic logic circuit implemented utilizing domino logic. Circuit 10 includes a precharge transistor 12, a discharge transistor 14, a domino logic block 16, an inverter 18, and a feedback transistor 22. As illustrated in FIG. 1E, precharge transistor 12 is turned on and precharges node X to a logic high state during the precharge phase of clock signal 8. Then, in response to the rising edge (i.e., evaluate phase) of clock signal 8, discharge transistor 14 is turned on and discharges node Y to a logic low state. During the evaluate phase, node X will either remain at a logic high state or discharge to the logic low state of node Y depending upon the logic states of the logic inputs and the logic function implemented by domino logic block 16. Examples of various implementations of domino logic block 16 are depicted in FIGS. 1B, 1C, and 1D, which respectively illustrate a two-input AND gate 30, a two-input OR gate 32, and a two-input multiplexer 34. During both of the precharge and evaluate phases of clock signal 8, the logic state of node X is inverted by inverter 18 to obtain output signal 20, which is latched by the operation of feedback transistor 22.

Figure 2A:
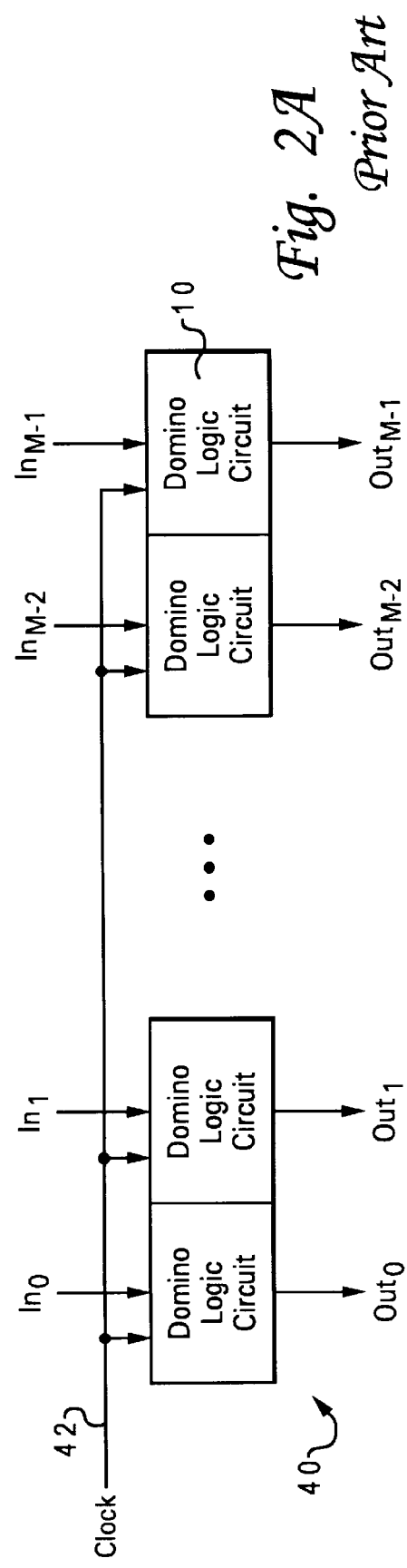
FIG. 2A is a block diagram representation of a row of domino logic.

Referring now to FIG. 2A, a block diagram of a conventional row of domino logic circuitry is depicted. As illustrated, row 40 includes M domino logic circuits 10, which may implement the same or different logic functions. The M domino logic circuits 10 forming row 40 each receive a respective set of input signals ($IN_{M-1}$) and generate a respective output signal ($OUT_{M-1}$) in response to the evaluate phase of clock signal 42. In order to implement a complex logic function, such as that performed by the arithmetic logic unit (ALU) of a processor, a series of rows 40 can be coupled together sequentially, as shown in FIG. 2B.

Figures 2B, 2C:
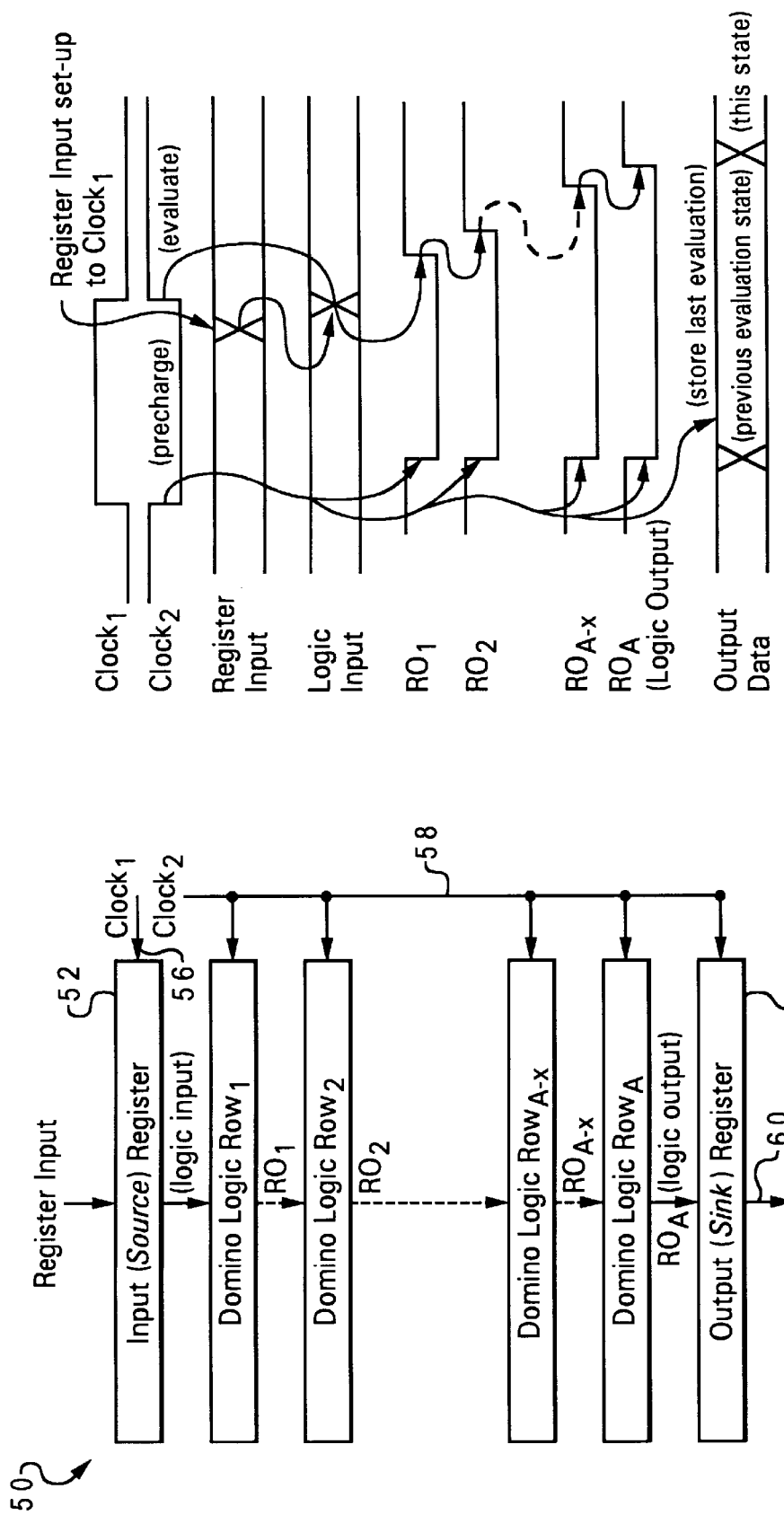
FIG. 2B illustrates a conventional multiple-row domino logic circuit.
FIG. 2C is a timing diagram depicting the operation of the conventional multiple-row domino logic circuit shown in FIG. 2B.

With reference to FIG. 2B, there is illustrated a conventional multiple-row dynamic logic circuit 50 including an input register 52, domino logic rows 1 through A, and an output register 54. As shown, input register 52 latches and stores register input values in response to a first clock signal 56, while domino logic rows 1 through A and output register 54 operate in response to a second clock signal 58 that is 180° out of phase with the first clock signal 56.

Referring now to FIG. 2C, which is an exemplary timing diagram of the operation of circuit 50, input register 52 latches the register input in response to first clock signal 56 making a transition from a logic low state to a logic high state. When first clock signal 56 makes a transition to a logic high state, second clock signal 58 makes a transition to a logic low state to initiate a precharge phase in which the domino logic circuits within each of domino logic rows 1 through A are precharged to a known state. As explained supra with respect to FIG. 1E, the output of each individual domino logic circuit is set to a logic low state during the precharge phase. Accordingly, FIG. 2C illustrates each of row output signals $RO_1$–$RO_A$ making a transition from a logic high state to a logic low state in response to second clock signal 58 entering the precharge phase.

Thereafter, in response to second clock signal 58 entering the evaluate phase, input register 52 outputs its contents as the logic input of domino logic row 1. In response to receipt of the logic input and the evaluate phase of second clock signal 58, domino logic row 1 evaluates the logic input and generates row output 1 ($RO_1$), which is fed to domino logic row 2 as a logic input. In response to receipt of $RO_1$ and the evaluate phase of second clock signal 58, domino logic row 2 evaluates $RO_1$ to generate $R0_2$, which is feed to domino logic row 3. This process continues until all of domino logic rows 1 through A have evaluated their respective inputs. Finally, $RO_A$ is stored in output register 54 in response to second clock signal 58 entering the precharge phase and first clock signal 56 returning to a logic high state. During the next cycle, the contents of output register 54 are output as output data 60. Importantly, each of the logic rows within conventional multiple-row dynamic logic circuit 50 illustrated in FIG. 2B evaluates its inputs during each clock cycle, regardless of whether or not the contents of input register 52 change. Thus, when the contents of input register 52 remain stable across multiple clock cycles, circuit 50 needlessly dissipates power by evaluating each of domino logic rows 1 through A.

Figure 3A:
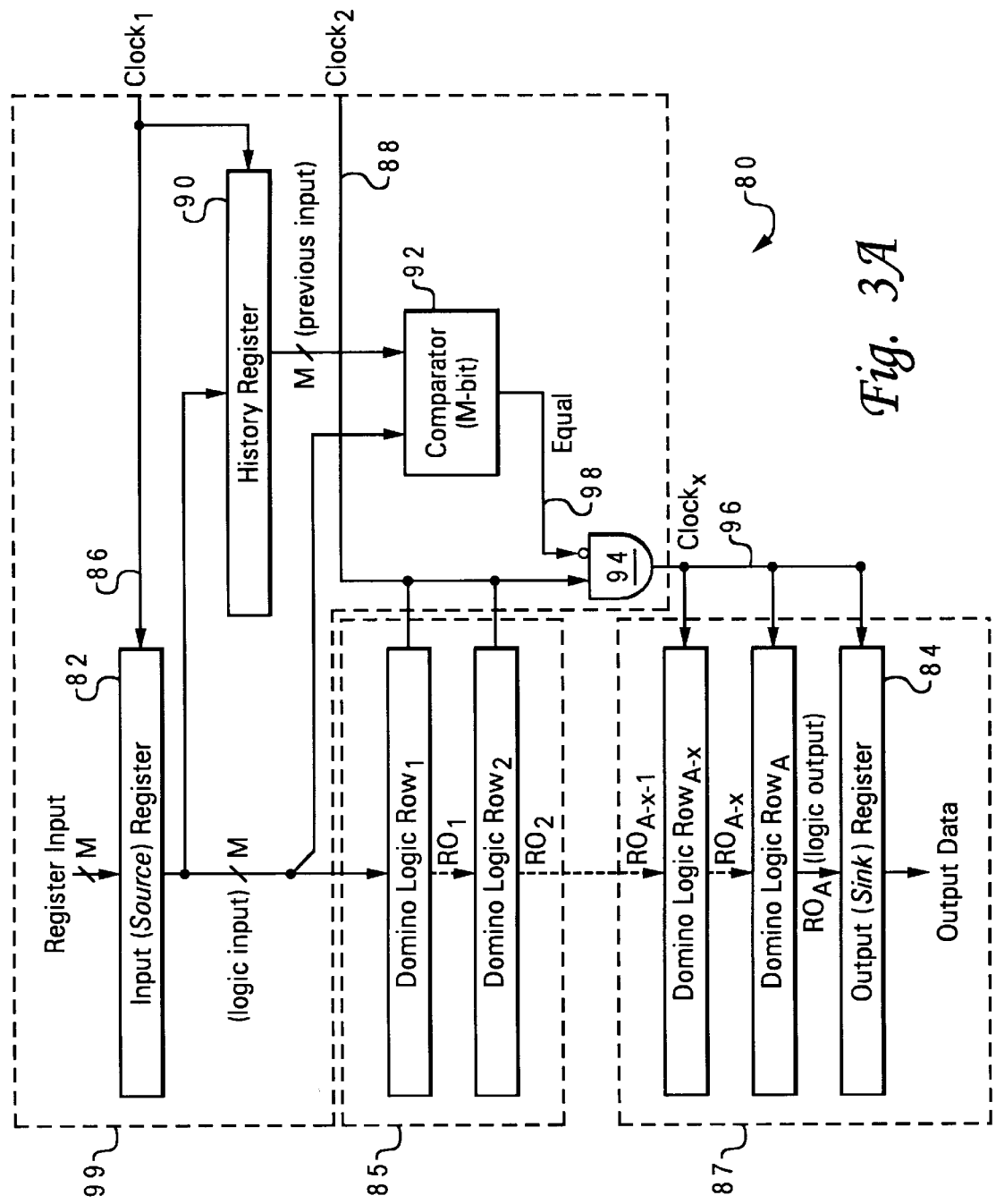
FIG. 3A is a block diagram of an illustrative embodiment of a multiple-row domino logic circuit in accordance with the present invention.

Referring now to FIG. 3A, there is depicted an illustrative embodiment of a reduced-power multiple-row dynamic logic circuit in accordance with the present invention. Like circuit 50 of FIG. 2B, circuit 80 of FIG. 3A includes an input register 82, A rows of sequentially coupled domino logic, an output register 84, a first clock signal 86, and a second clock signal 88. In addition, circuit 80 includes a history register 90 that stores the contents of input register 82 from the immediately previous cycle of first clock signal 86, a comparator 92 that compares the contents of history register 90 and input register 82, and an AND gate 94 that generates a third clock signal 96 in response to second clock signal 88 and the equal signal 98 output by comparator 92. Importantly, third clock signal 96, which controls the evaluation of inputs by the last X of the A domino logic rows, is inactive during the evaluate phase of second clock signal 88 when comparator 92 indicates that the contents of input register 82 and history register 90 are equivalent. In this manner, the contents of output register 84 remain unchanged (as would be the case if the last X domino logic rows did evaluate their inputs), and power dissipation by circuit 80 is reduced.

As shown in FIG. 3A, input register 82, history register 90, comparator 92, and AND gate 94 of circuit 80 together form comparing circuitry 99; the first A-X domino logic rows 84 of circuit 80 form a first evaluation circuit 85; and the last X domino logic rows 84 of circuit 80 form a second evaluation circuit 87.

Figure 3B:
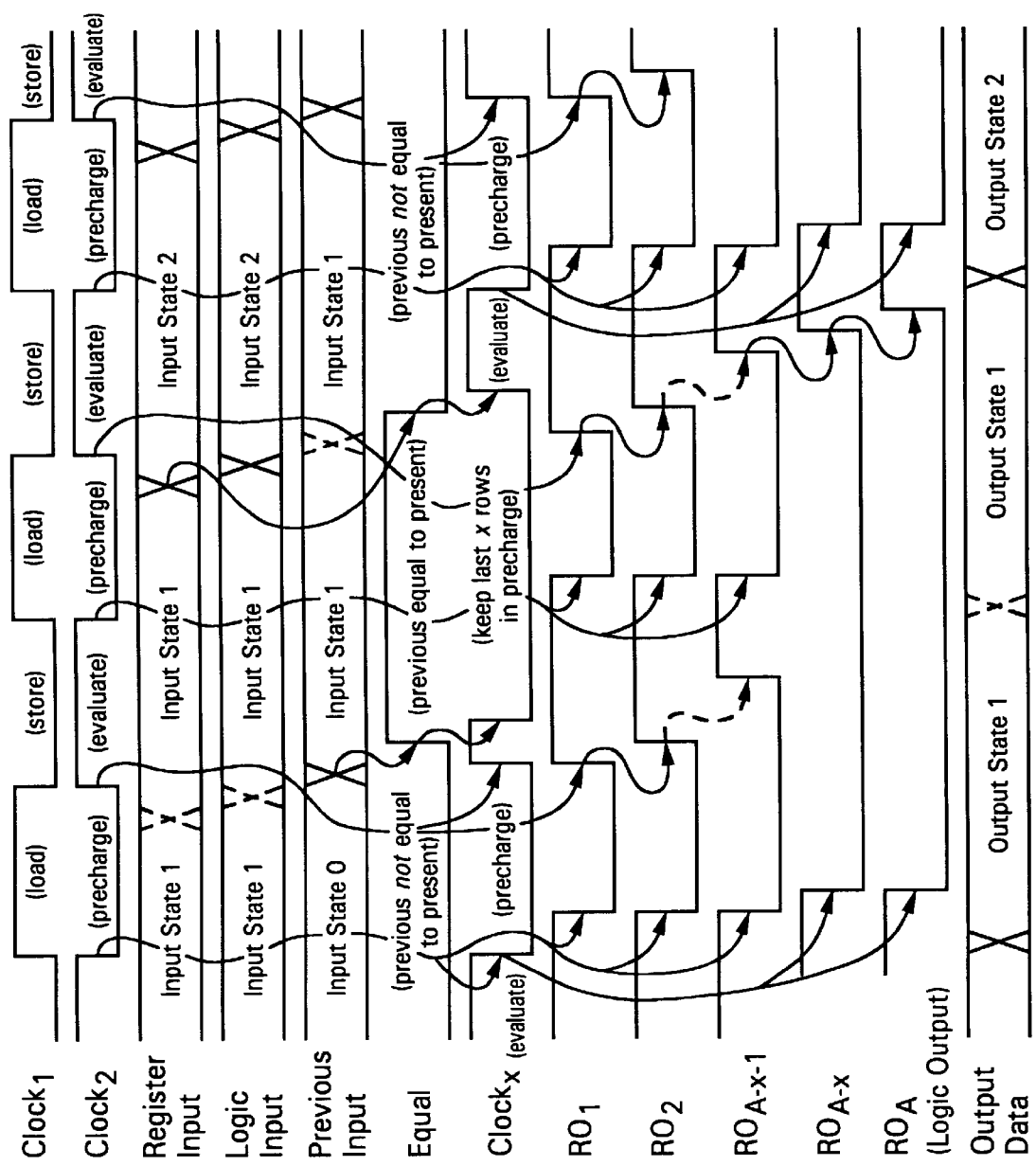
FIG. 3B is a timing diagram depicting the operation of the multiple-row domino logic circuit illustrated in FIG. 3A.

With reference now to FIG. 3B, there is illustrated a timing diagram of the operation of circuit 80 of FIG. 3A. As depicted, when first clock signal 86 rises, register input state 1 is loaded into input register 82. In parallel, input state 0, the previous state of input register 82, is loaded into history register 90. In addition, the row output (RO) of each of domino logic rows 1 through A is set to a logic low state in response to the falling edge of second clock signal 88. When second clock signal 88 rises at the beginning of the evaluate phase, domino logic rows 1 through A-X-1 evaluate sequentially. That is, domino logic row 1 evaluates and generates $RO_1$, which is received as an input by domino logic row 2. Domino logic row 2 similarly evaluates $RO_1$ to generate $R0_2$. This process continues until domino logic row A-X is encountered.

In parallel with the evaluation of inputs by domino logic rows 1 through A-X-1, comparator 92 compares the contents of history register 90 and input register 82. If the contents of history register 90 and input register 82 are equivalent, equal signal 98 output by comparator 92 is logic high. Alternatively, if the contents of history register 90 and input register 82 are not equivalent, equal signal 98 is logic low. If equal signal 98 is logic low, third clock signal 96 follows second clock signal 88, and domino logic rows A-X through A evaluate sequentially until $RO_A$ generated by domino logic row A is loaded into output register 84 on the falling edge of third clock signal 96.

On the other hand, if equal signal 98 is logic high (as illustrated in FIG. 3B), third clock signal 96 is forced to a logic low state before $RO_{A-X-1}$ is received as an input by domino logic row A-X. Consequently, the last X rows of domino logic remain in a precharge state for the remainder of the current cycle of second clock signal 88. Because output register 84 does not receive a falling edge of third clock signal 96, the previous output state (i.e., output state 1) is retained. Thus, circuit 80 conserves power by eliminating the evaluation of X rows of logic.

In order for domino logic rows A-X through A to subsequently correctly evaluate new input data, equal signal 98 must return to a logic low state before $RO_{A-X-1}$ is received at domino logic row A-X. Consequently, circuit 80 is subject to a timing requirement that the evaluation time of comparator 92 plus the delay of AND gate 94 must be less than the worst case (i.e., fastest) evaluation time of domino logic rows 1 through A-X-1. In order to ensure proper operation, an additional time margin is preferably taken into account to compensate for process and operating temperature variations. An equation summarizing this relationship is given below:

$$T_e > T_c + T_a + T_m,$$

where $T_e$ is the evaluation time of dynamic logic rows 1 through A-X-1, $T_c$ is the evaluation time of comparator 92, $T_a$ is the delay associated with AND gate 94, and $T_m$ is the timing margin.

As has been described, the present invention provides a reduced power dynamic logic circuit that selectively inhibits evaluation of one or more rows of logic in order to reduce unnecessary power dissipation in cases in which the circuit inputs remain unchanged. Importantly, the ability of a dynamic logic circuit in accordance with the present invention to inhibit evaluation of one or more rows of logic is not dependent upon a prior determination that the circuit inputs remain unchanged.

While the invention has been particularly shown and described with reference to a preferred embodiment, it will be understood by those skilled in the art that various changes in form and detail may be made therein without departing from the spirit and scope of the invention. For example, the present invention is not limited to embodiments that utilize clocked dynamic logic as shown in FIG. 3A. Rather, the present invention encompasses alternative embodiments that replace the first and second clock signals shown in FIG. 3A with signals generated by self-timed circuitry.

What is claimed is:

1. Dynamic logic circuitry comprising:

first dynamic logic evaluation circuitry for evaluating a sequence of inputted values, including a first one of such values and a next one of such values, wherein the evaluating generates a respective sequence of results, including respective first and next results;

second dynamic logic evaluation circuitry for receiving the sequence of results from the first dynamic logic evaluation circuitry and for evaluating in response to a certain signal; and comparing circuitry for comparing the inputted values, wherein the comparing inhibits the certain signal, so that the second dynamic circuitry does not evaluate the next result when such a first one and next one of such values are equivalent.

2. The dynamic logic circuitry of claim 1, wherein the comparing circuitry compares such a first value with such a next value while the first dynamic logic evaluation circuitry evaluates the next value, and wherein the comparing circuitry inhibits the certain signal before the second dynamic logic evaluation circuitry receives the respective next result.

3. The dynamic logic circuitry of claim 1, wherein the first dynamic logic evaluation circuitry includes clocked dynamic logic circuitry, and the certain signal is responsive to a clock signal.

4. The dynamic logic circuitry of claim 1, wherein the first dynamic logic evaluation circuitry includes self-timed dynamic logic evaluation circuitry, and the certain signal is responsive to a signal generated by the first dynamic logic evaluation circuitry.

5. A circuit, comprising:

a circuit data input and a circuit data output;

a row clock signal that selectively oscillates between an active state and an inactive state;

a row of dynamic logic having a row clock input coupled to said row clock signal, a row data input, and a row data output coupled to said circuit data output, wherein a input value received at said row data input is derived from a current value at said circuit data input and wherein said row evaluates said input value in response to said active state of said row clock signal;

a comparator that compares said current value at said circuit data input and a previous value at said circuit data input; and a switch that sets the row clock signal received at said row clock input to said inactive state and temporarily maintains said row clock signal in said inactive state in response to said comparator detecting that said current value and said previous value are equivalent, such that said row of dynamic logic does not evaluate said input value.

6. The circuit of claim 5, wherein said row of dynamic logic is a second row of dynamic logic and said row clock signal is a second row clock signal, said circuit further comprising:

a first row of dynamic logic having a row clock input coupled to a first row clock signal, a row data input coupled to said circuit data input, and a row data output coupled to said row data input of said second row, wherein said first row evaluates an input value at its row data input in response to an active state of said first row clock signal while said second row clock signal is temporarily maintained in said inactive state by said switch.

7. The circuit of claim 6, wherein said first row of dynamic logic is one row among one or more sequentially coupled rows of dynamic logic that are coupled to said first row clock input, wherein a total evaluation time of said comparator and said switch is less than a total evaluation time of said one or more sequentially coupled rows coupled to said first row clock input.

8. The circuit of claim 5, wherein:

said circuit further comprises a register that stores said previous value at said circuit data input; and said comparator has a first comparator input coupled to said register, a second comparator input coupled to said circuit data input, and a comparator output that indicates whether a value at said first comparator input is equivalent to a value at said second comparator input.

9. The circuit of claim 8, and further comprising an input register that supplies said current value to said circuit data input.

10. The circuit of claim 5, and further comprising an AND gate including said switch.

11. The circuit of claim 5, wherein said row of dynamic logic comprises domino logic.

12. An integrated circuit, comprising:

a first subcircuit that includes one or more sequentially coupled rows of dynamic logic that each include a row data input, a row data output, and a row clock input coupled to a first row clock signal;

a second subcircuit coupled to said first subcircuit, said second subcircuit including one or more sequentially coupled rows of dynamic logic that each include a row data input, a row data output, and a row clock input;

a circuit data input coupled to said first subcircuit;

a comparator that compares a current value at said circuit data input and a previous value at said circuit data input; and a switching circuit having an input coupled to said first row clock signal and an output coupled to each row clock input within said second subcircuit, wherein said switching circuit provides a second row clock signal at said output only when said comparator detects that said current value and said previous value are not equivalent.

13. The integrated circuit of claim 12, wherein a total evaluation time of said comparator and said switching circuit is less than a total evaluation time of said one or more sequentially coupled rows in said first subcircuit.

14. The integrated circuit of claim 12, wherein:

said integrated circuit further comprises a register that stores said previous value at said circuit data input; and said comparator has a first comparator input coupled to said register, a second comparator input coupled to said circuit data input, and a comparator output that indicates whether a value at said first comparator input is equivalent to a value at said second comparator input.

15. The integrated circuit of claim 14, and further comprising an input register that supplies said current value to said circuit data input.

16. The integrated circuit of claim 12, said switching circuit comprising an AND gate.

17. The integrated circuit of claim 12, wherein said second subcircuit comprises domino logic.

18. A method of operating an integrated circuit including at least one row of dynamic logic, said method comprising:

storing a previous circuit input value;

receiving a current circuit input value;

in response to receipt of said current circuit input value, comparing said current circuit input value and said previous circuit input value; and in response to said comparison indicating that said current circuit input value and said previous circuit input value are equivalent, setting a row clock signal utilized to evaluate inputs of said at least one row to an inactive state during an evaluation phase.

19. The method of claim 18, wherein said at least one row of dynamic logic forms a second subcircuit, said row clock signal is a second row clock signal, and said integrated circuit includes a first subcircuit including at least one row of dynamic logic that evaluates inputs in response to a first clock signal, said method further comprising:

evaluating inputs of rows in said first subcircuit while said second row clock signal is set to said inactive state.

20. The method of claim 19, wherein a total time utilized to compare said current circuit input value and said previous circuit input value and to set said second row clock to said inactive state is less than a total evaluation time of all rows in said first subcircuit.

21. The method of claim 19, said setting step comprising:

evaluating said first clock signal and another signal indicating whether said current circuit input value and said previous circuit input value are equivalent utilizing an AND gate having an output that provides said second row clock signal.

* * * * *